United States Patent
Hong et al.

(10) Patent No.: US 8,207,616 B2
(45) Date of Patent: Jun. 26, 2012

(54) ADHESIVE FILM, DICING DIE BONDING FILM AND SEMICONDUCTOR DEVICE USING THE SAME

(75) Inventors: Jong Wan Hong, Daejeon (KR); Jang Soon Kim, Daejeon (KR); Hyo Soon Park, Daejeon (KR); Hyun Jee Yoo, Daejeon (KR); Dong Han Kho, Daegu (KR); Hyo Sook Joo, Anyang-si (KR)

(73) Assignee: LG Chem, Ltd., Seoul (KR)

( * ) Notice: Subject to any disclaimer, the term of this patent is extended or adjusted under 35 U.S.C. 154(b) by 162 days.

(21) Appl. No.: 12/738,560

(22) PCT Filed: Oct. 24, 2008

(86) PCT No.: PCT/KR2008/006300
§ 371 (c)(1),
(2), (4) Date: Jul. 19, 2010

(87) PCT Pub. No.: WO2009/075472
PCT Pub. Date: Jun. 18, 2009

(65) Prior Publication Data
US 2010/0289158 A1    Nov. 18, 2010

(30) Foreign Application Priority Data
Dec. 10, 2007 (KR) .................. 10-2007-0127741

(51) Int. Cl.
*H01L 23/52* (2006.01)
*H01L 23/48* (2006.01)
*H01L 29/40* (2006.01)

(52) U.S. Cl. .............. 257/783; 257/E21.514; 257/781; 257/782; 428/339; 428/355 AK; 428/414; 525/523; 438/118

(58) Field of Classification Search ........... 257/E23.018, 257/E21.514, E21.509, E21.598, E23.141, 257/781–783, 785; 428/41.3, 323, 335, 336, 428/339, 347, 355 AK, 414, 473.5, 500; 525/77, 525/217, 420, 523, 533; 438/114, 118; 264/1.7; 524/606
See application file for complete search history.

(56) References Cited

U.S. PATENT DOCUMENTS

| 8,115,322 B2* | 2/2012 | Arifuku et al. ............... 257/783 |
| 2003/0211291 A1* | 11/2003 | Castiglione et al. ........ 428/172 |
| 2008/0311332 A1* | 12/2008 | Sakurai et al. .............. 428/41.3 |
| 2010/0167073 A1* | 7/2010 | Kitakatsu .................. 428/473.5 |

(Continued)

FOREIGN PATENT DOCUMENTS
JP    08-060112 A    3/1996
(Continued)

*Primary Examiner* — Chris Chu
(74) *Attorney, Agent, or Firm* — McKenna Long & Aldridge LLP

(57) ABSTRACT

The present invention relates to an adhesive film, a dicing die bonding film and a semiconductor device. More specifically, the adhesive film of the present invention is characterized by comprising a base film and an adhesive layer and having a yield strength of 20 to 50 gf and a slope of tensile elastic region of 30 to 80 gf/mm at a thickness of 5 to 50 μm. In the present adhesive film, the yield strength and the slope of tensile elastic region are controlled so that the incidence of burrs may be predicted and controlled depending on thickness of an adhesive layer. The dicing die bonding film, and the semiconductor device comprising the same have lower incidence of burrs and an excellent workability and reliability.

20 Claims, 1 Drawing Sheet

U.S. PATENT DOCUMENTS

2010/0178496 A1* 7/2010 Masuda et al. ............... 428/347
2010/0215924 A1* 8/2010 Di Pede ........................ 428/196
2010/0261314 A1* 10/2010 Takamoto et al. ............ 438/114
2011/0111218 A1* 5/2011 Yoo et al. ..................... 428/339

FOREIGN PATENT DOCUMENTS

| JP | 2006-073982 A | 3/2006 |
| JP | 2007-005436 A | 1/2007 |
| KR | 10-2007-0089851 A | 3/2007 |

* cited by examiner

[Figure 1]
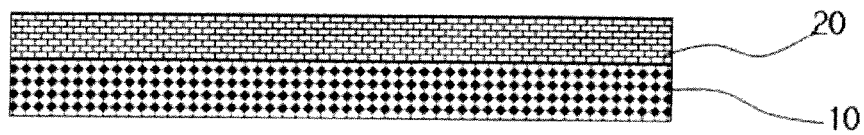
[Figure 2]
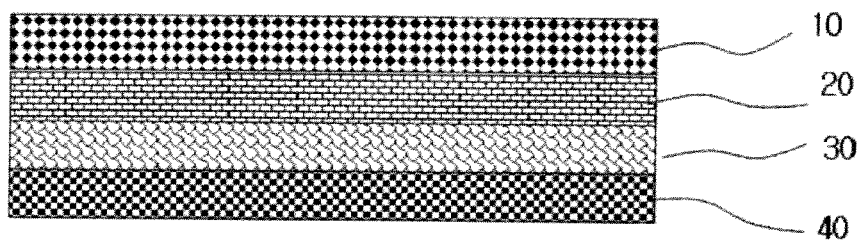
[Figure 3]
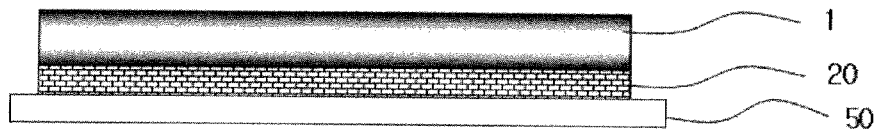
[Figure 4]
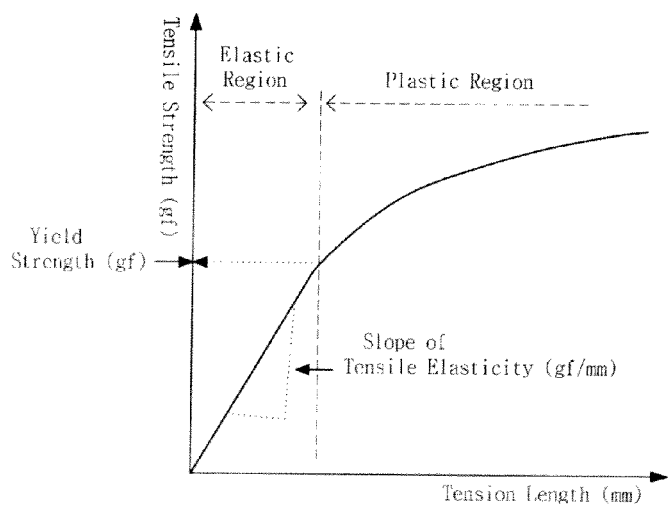

ADHESIVE FILM, DICING DIE BONDING FILM AND SEMICONDUCTOR DEVICE USING THE SAME

This application is a National Stage Entry of International Application No. PCT/KR2008/006300, tiled Oct. 24, 2008, and claims priority to Korean Patent Application No. 10-2007-0127741, tiled in Korea on Dec. 10, 2007, which is hereby incorporated by reference in its entirety as if fully set forth herein.

TECHNICAL FIELD

The present invention relates to an adhesive film, a dicing die bonding film and a semiconductor device. More specifically, the present invention relates to an adhesive film, in which a yield strength and a slope of tensile elastic region of an adhesive layer are controlled so that the incidence of burrs may be predicted and controlled, a dicing die bonding film and a semiconductor device comprising the same.

BACKGROUND ART

Generally, a process for preparing a semiconductor chip comprises a step of forming fine patterns on a wafer and a step of polishing and packaging the wafer, so as to meet standards of the final device. Said packaging process comprises a step of inspecting a wafer, wherein defectives of semiconductor chips are inspected; a step of dicing, wherein a wafer is cut to separate into each chip; a step of die bonding, wherein the separated chip is attached to a circuit film or a loading plate of a lead frame; a step of wire bonding, wherein circuit pattern of the circuit film or the lead frame is connected to chip pads provided on the semiconductor chip with an electrical connecting means such as a wire; a step of molding, wherein the outside is surrounded with a sealing agent to protect interior circuits of the semiconductor chip and the other parts; a step of trimming, wherein dambar connecting a lead to a lead is cut; a step of forming, wherein the lead is bent into the desired shape; and a step of inspecting a finished product, wherein the finished package is inspected for defective.

In said dicing step, the wafer is cut in a certain thickness using a diamond wheel, and the like. Here, to fix the wafer, a dicing die bonding film is laminated on the back side of the wafer, on which patterns are not formed, under an appropriate temperature condition.

Generally, as shown in FIG. 2, a dicing die bonding film consists of a dicing film and a die bonding film, which is attached to the back side of wafer that patterns are not formed. In a dicing process, the whole wafer and a part of the base films of the die bonding film is cut, using a diamond wheel (blade).

In such a dicing process, a wafer is damaged by applying excessive pressure or mechanical impact thereto, and chippings are generated, thereby causing to frequently generate burrs which may contaminate patterns. In addition, while the thickness of wafer is thinned as the packaging has a small size and the dicing conditions become severe for increase of production efficiency, said problems frequently happen. Especially, while the thickness of wafer decreases, there are many cases in which even burrs having a length in a level without any problem formerly, climb onto a die, and they cause defectives.

A component of burrs climbing onto the die is principally a die bonding film. The reason is as follows. A pressure sensitive adhesive part of a dicing film is coated on a base film and well adhered thereto, so that in dicing, there are few cases in which burrs climb onto the die, even though burrs are caused by the pressure sensitive adhesive part and the base film. But, the die bonding film is mechanically laminated with the pressure sensitive adhesive part of the dicing film via a tailoring process and completely cut. Therefore, its adhesion strength is relatively lowered, so that incidence of burrs to climb onto the die increases. To solve this problem, it is important to increase adhesion of the pressure sensitive adhesive part of the dicing film to the die bonding film, and of the wafer to the die bonding film. However, when an adhesive film has high adhesion strength to increase the adhesion, it has a low elasticity, so that the burr amount increases by elongation of the die bonding film itself. When the die bonding film has too high elasticity, it has low adhesion strength, so that on dicing, shaking increases and the burr incidence rises. Therefore, it is a major factor, for lowering the burr incidence, to control the elasticity of the adhesive film.

In Japanese Unexamined Patent Publication No. 2005-330300, an adhesive resin composition having a tensile elasticity of 0.5 MPa or less at 100° C. or less before thermosetting, of 0.2 MPa or more at 180° C., and of 1 MPa to 10 MPa at 260° C. after thermosetting is disclosed. However, considering the dicing process to generate heat at a moment, it has a limit in expecting characteristics of a film, to measure elasticity in a condition that heat is sufficiently applied to a specimen with a certain speed of elevating temperature. In addition, it was confirmed as research results of the present invention that the burr incidence depends on thickness, despite of the same composition and elasticity, and it had hard to control burrs by conventional measurements of elasticity.

Therefore, a novel method is required, which may predict and control burr incidence in the die bonding film, and thus, it needs to provide a semiconductor device having excellent workability and reliability.

DISCLOSURE

Technical Problem

The present invention is intended to solve the problems of prior art as described above, and to provide an adhesive film, wherein the yield strength and the slope of tensile elastic region of an adhesive layer are controlled so that the burr incidence may be predicted and controlled depending on thickness of the adhesive film, a dicing die bonding film and a semiconductor device comprising the same.

Technical Solution

As means for solving said problem, the present invention provides an adhesive film comprising a base film and an adhesive layer, wherein said adhesive layer has a yield strength of 20 to 50 gf and a slope of tensile elastic region of 30 to 80 gf/mm at a thickness of 5 to 50 μm.

As another means for solving said problem, the present invention provides a dicing die bonding film comprising a dicing film, and the adhesive film, according to the present invention, formed on one side of said dicing film.

As another means for solving said problem, the present invention provides a semiconductor wafer, wherein the adhesive film in the dicing die bonding film according to the present invention is attached to one side of the wafer and the dicing film is fixed on a wafer ring frame.

As the other means for solving said problem, the present invention provides a semiconductor device comprising a wiring substrate; the adhesive layer, according to the present invention, attached to the chip-loading side of the wiring substrate; and a semiconductor chip loaded on said adhesive layer.

Advantageous Effects

The present invention controls the yield strength and the slope of tensile elastic region by controlling components and amounts of the adhesive film. And the dicing die bonding film, comprising the adhesive film having a particular yield strength and slope of tensile elastic region, lowers burr incidence in the dicing process, which improves workability and reliability in process for preparing semiconductor devices.

DESCRIPTION OF DRAWINGS

FIG. 1 is a cross-section view of an adhesive film (die bonding film) according to one aspect of the present invention.

FIG. 2 is a cross-section view of a dicing die bonding film according to one aspect of the present invention.

FIG. 3 is a cross-section view of a semiconductor device according to one aspect of the present invention.

FIG. 4 is a tension curve obtained from a tension experiment about an adhesive layer, and represents a yield strength and slope of tensile elastic region.

DESCRIPTION OF REFERENCES IN DRAWINGS

1: semiconductor chip
10: base film of adhesive film
20: adhesive layer of die bonding film
30: pressure sensitive adhesive layer of dicing film
40: base film of dicing film
50: wiring substrate

BEST MODE

The present invention relates to an adhesive film comprising a base film and an adhesive layer, wherein said adhesive layer has a yield strength of 20 to 50 gf and a slope of tensile elastic region of 30 to 80 gf/mm at a thickness of 5 to 50 µm. Said yield strength and tensile elastic region slope may be controlled depending on thickness of the adhesive layer. It is preferred that when the thickness of the adhesive layer is thick, the yield strength and the slope of tensile elastic region are lowered, and when it is thin, they are raised.

In the present invention, it is considered that characteristic of burr incidence is changed depending on thickness of the adhesive layer. The present invention is characterized in that the burr incidence is predicted and controlled by specifying the yield strength and the slope of tensile elastic region depending on thickness of the adhesive layer.

If the yield strength of the adhesive layer in said adhesive film is less than 20 gf, the burr incidence is raised by elongation of the film itself. If it is more than 50 gf, the burr incidence is raised due to lowering of adhesion strength. In addition, if the slope of tensile elastic region of the adhesive layer is less than 30 gf/mm, the burr incidence is raised by elongation of the film itself. If it is more than 80 gf/mm, the burr incidence is raised due to lowering of adhesion strength.

Herein, "yield strength" means the stress at a turning point from the elastic region to the plastic region in a tensile curve obtained from a tensile experiment about the adhesive layer, and "slope of tensile elastic region" means the slope of the elastic region in said tensile curve.

The yield strength and the slope of tensile elastic region may be controlled by components, ratios and amounts of the adhesive layer composition. The specific method for controlling the yield strength and the slope of tensile elastic region of the adhesive layer is described below.

The components of the adhesive layer composition are not particularly limited. But, for example, a thermoplastic resin and a thermosetting resin may be used in a mixture thereof. Here, it is preferred that the thermosetting resin is used together with a hardener. Said thermoplastic resin is a desired component in view of elasticity and initial adhesive characteristic, and said thermosetting resin is a desired component in view of bond strength at high temperature and heat resistance.

When a thermoplastic resin and a thermosetting resin are used in a mixture thereof as a component of the adhesive layer composition, the yield strength and the slope of tensile elastic region may be controlled by regulating a mixing ratio of said thermoplastic resin and the thermosetting resin comprising a hardener. When the ratio of thermoplastic resin becomes higher, the yield strength and the slope of tensile elastic region are decreased.

To have the yield strength and the slope of tensile elastic region according to the present invention, the mixing ratio of the thermoplastic resin and the thermosetting resin comprising a hardener (thermoplastic resin/thermosetting resin) is preferably 1 to 5, and more preferably 1 to 3. If said ratio is less than 1, workability is lowered in tailoring the adhesive film. If said ratio is more than 5, tension proceeds too much, many burrs are generated, heat resistance is lowered, so that a problem is caused in reliability.

An example of usable thermoplastic resins herein includes an acrylic copolymer comprising a functional group crosslinkable with the thermosetting resin, and as its specific example, one or more monomers selected from the group consisting of a monomer containing hydroxy such as 2-hydroxyethyl (meth)acrylate, 2-hydroxypropyl (meth)acrylate, 2-hydroxybutyl (meth)acrylate, 4-hydroxybutyl (meth)acrylate, 2-hydroxyethylene glycol (meth)acrylate, or 2-hydroxylpropylene glycol (meth)acrylate; a monomer containing carboxyl group such as acrylic acid, methacrylic acid, acrylic acid dimer, itaconic acid, or maleic acid; a monomer containing nitrile group such as (meth)acrylonitrile; and a monomer comprising glycidyl group such as glycidyl (meth)acrylate may be used.

When the acrylic copolymer is used as the thermoplastic resin, the yield strength and the slope of tensile elastic region of the adhesive layer may be controlled by regulating a glass transition temperature of the thermoplastic resin. As it has low glass transition temperature, the yield strength and the slope of tensile elastic region is reduced.

To have the yield strength and the slope of tensile elastic region according to the present invention, the acrylic copolymer has preferably a glass transition temperature of −10 to 30° C., and more preferably 0 to 20° C. If said glass transition temperature is less than −10° C., tension proceeds too much and the burr incidence becomes higher, so that the handling property is much deteriorated. In addition, if said glass transition temperature is more than 30° C., the elasticity is increased, the pressure sensitive adhesive property is lowered, and the defective incidence becomes higher in laminating.

In addition, preferably, said acrylic copolymer has a molecular weight of 100,000 to 2,500,000. If said molecular weight is less than 100,000, a problem may be caused in heat resistance. If it is more than 2,500,000, a problem may be caused in the filling property.

The usable thermoplastic resin herein is a resin which may be hardened by heating and reacting functional groups in compounds, and includes an epoxy resin, preferably together with an epoxy hardener. As a specific example of said epoxy resin, it may include cresol novolac epoxy resin, bisphenol A type novolac epoxy resin, phenol novolac epoxy resin, tetrafunctional epoxy resin, biphenyl type epoxy resin, triphenol methane type epoxy resin, alkyl modified triphenol methane epoxy resin, naphthalene type epoxy resin, dicyclopentadiene type epoxy resin, dicyclopentadiene modified phenol type epoxy resin, and the like. They may be used alone or in a mixture of two or more.

In addition, preferably, said epoxy hardener includes multifunctional phenol resin, and more preferably, one whose moisture absorptivity is 2.0% by weight or less on treating it by PCT (Pressure Cooker Test: 121° C./100%/2 atm) for 48 hours, in view of moisture resistance at high temperature. As a specific example of said multifunctional phenol resin, it may include bisphenol A type resin, phenol novolac resin, cresol novolac resin, bisphenol A type novolac resin, phenol aralkyl resin, multifunctional novolac resin, dicylcopentadiene phenol novolac resin, aminotriazine phenol novolac resin, polybutadiene phenol novolac resin, and the like. They may be used alone or in a mixture of two or more.

Furthermore, when the adhesive layer composition comprises filler, the yield strength and the slope of tensile elastic region may be controlled by regulating the amount of the filler. As the amount of the filler is increased, the yield strength and the slope of tensile elastic region are increased. When the adhesive layer composition of the present invention includes the filler, the amount of the filler is preferably 5 to 20 parts by weight, and more preferably 8 to 15 parts by weight, relative to 100 parts by weight of the adhesive layer composition. If said amount is less than 5 parts by weight there are problems in reliability due to high thermal expansion coefficient as well as high burr incidence. If it is more than 20 parts by weight, the adhesive property is lowered.

As a kind of the filler, it may include ceramic particles such as silica or alumina; hydroxide particles such as aluminum hydroxide or calcium hydroxide; and carbon-based particles, and the like. They may be alone or in a mixture of two or more. Preferably, the ceramic particles are used, which have excellent insulating property, stability at high temperature and easiness to prepare them to a nano size. More preferably, silica is used. In addition, the filler is preferably used, which has an average particle diameter of 1 to 100 nm. If said average particle diameter is less than 1 nm, there is a problem in dispersibility. If it is more than 100 nm, it has excellent filling property, but it has high burr incidence, since the increase of elasticity is not high.

Said each of materials is included as usable examples herein. In preparing the film of the present invention, the present invention is not limited to the materials, but usual materials in this field may be used without restriction.

In addition, the yield strength and the slope of tensile elastic region may be also controlled by drying temperature, drying speed, wind velocity, air volume, or stirring condition in preparing a die bonding film as well as components, ratios or amounts of the adhesive layer composition.

The process for preparing the adhesive film of the present invention is not particularly limited. For example, it may be prepared by a first step of dissolving or dispersing an adhesive layer composition in a solvent to prepare a resin varnish; a second step of applying said resin varnish on a base film; and a third step of heating said base film to remove the solvent.

In said first step, components and amounts of the adhesive layer composition are defined as described above, and as a varnishing solvent for preparing said adhesive layer composition, methylethyl ketone (MEK), acetone, toluene, dimethylformamide (DMF), methylcellosolve (MCS), tetrahydrofuran (THF), N-methylpyrrolidone (NMP), and the like may be usually used. In case where said adhesive layer composition includes a filler, ball mill, bead mill, 3 roll mill, or crusher may be used alone or even in a combination thereof for enhancing a dispersibility of the adhesive layer. As a material of ball or bead, it may include glass, alumina, zirconium, and the like. In terms of particle dispersibility, a material of ball or bead is preferably zirconium.

As a usable base film in said second step, a plastic film such as a polyethyleneterephtalate film, a polytetrafluoroethylene film, a polyethylene film, a polypropylene film, a polybutene film, a polybutadiene film, a vinyl chloride copolymer film, or a polyimide film, and the like may be used. In addition, a surface of said base film may be treated by a release agent. As the release agent used in release treating, alkyd-, silicon-, fluoro-, unsaturated ester-, polyolefin-, wax- or the like-based release agent is utilized. Especially, alkyd-, silicon-, or fluoro-based release agent is preferred due to heat resistance thereof.

As the method of applying the resin varnish on said base film, known methods may be utilized. For example, it may include a knife coat method, a spray coat method, a gravure coat method, a curtain coat method, a comma coat method, a lip coat method, and the like.

In the third step to remove a solvent by heating said base film, it is preferred for heating to be carried out at 70 to 250° C. for 5 to 20 minutes.

The present invention also relates to a dicing die bonding film comprising a dicing film; and an adhesive film, according to the present invention, formed on one side of said dicing film.

It is preferred that said dicing film comprises a base film; and a pressure sensitive adhesive layer formed on said base film.

The dicing die bonding film according to the present invention is explained below, with reference to FIG. 2.

The base film (40) of the dicing film may be a polyethylene film, a polypropylene film, a polytetrafluoroethylene film, a polyethyleneterephthalate film, a polyurethane film, an ethylene vinyl acetone film, an ethylene-propylene copolymer film, an ethylene-acrylic acid ethyl copolymer film, an ethylene-acrylic acid methyl copolymer film, or the like. If necessary, surface treatment such as primer application, corona treatment, etching treatment and UV treatment is preferably performed. When the pressure-sensitive adhesive is cured by UV irradiation, it may be also selected from one having good optical transparency.

The pressure-sensitive adhesive layer (30) of the dicing film may be usual ultraviolet curing pressure-sensitive adhesive or thermosetting pressure-sensitive adhesive. In case of the ultraviolet curing pressure-sensitive adhesive, the adhesion strength is lowered by irradiating it from the side of the base film with ultraviolet light, thereby increasing cohesive attraction and grass transition temperature of the pressure-sensitive adhesive. In case of the thermosetting pressure-sensitive adhesive, the adhesion strength is lowered by heating.

As such a method of preparing the dicing die bonding film according to the present invention, a method of hot roll laminating a dicing film and an adhesive film or a method of laminate pressing them may be used. The hot roll laminating method is preferred in view of capability of continuous processes and efficiency. Preferably, the condition for hot roll laminating is a pressure of 0.1 to 10 kgf/cm$^2$ at 10 to 100° C.

The present invention also relates to a semiconductor wafer, wherein the adhesive film of the dicing die bonding film according to the present invention is attached to one side of the wafer, and the dicing film of the dicing die bonding film is fixed on a wafer ring frame.

Such a semiconductor wafer may be prepared, by bonding the adhesive film of the dicing die bonding film to the back side of the semiconductor wafer at a laminate temperature of 0 to 180° C. and fixing the dicing film of said dicing die bonding film on the wafer ring frame.

The present invention also relates to a semiconductor device comprising a wiring substrate; the adhesive film, according to the present invention, attached to the chip loading side of said wiring substrate; and a semiconductor chip loaded on said adhesive film.

A process for preparing said semiconductor device is explained as follows.

The semiconductor wafer, to which the dicing die bonding film as described above is adhered, is completely cut using a dicing apparatus to divide into individual chips.

Then, if the dicing film is a ultraviolet curing pressure-sensitive adhesive, it is cured by irradiating it from the side of the base film with ultraviolet light. If it is a thermosetting pressure-sensitive adhesive, it is cured by rising a temperature. In the cured pressure-sensitive adhesive with ultraviolet light or heat as above, close adhesion strength to the adhesive is lowered, and thus pick-up of chips is easily performed in subsequent processes. At this time, if necessary, the dicing die bonding film may be expanded. If such an expanding process is practiced, the interval between chips is expanded, so that the pick-up is easily performed, and the creep between the adhesive layer and the pressure-sensitive adhesive layer is generated to improve the pick-up property. Continuously, chip pick up is practiced.

At this time, the semiconductor wafer and the pressures-sensitive adhesive layer of dicing die bonding film may be released from the adhesive layer of dicing die bonding film to obtain chips that the adhesive layer only is adhered thereto. The obtained chip, to which said adhesive layer is adhered, is adhered to a substrate for semiconductor. The adhering temperature of the chip is usually 100 to 180° C., the adhering time is 0.5 to 3 seconds, and the adhering pressure is 0.5 to 2 kgf/cm². When a crooked organic wiring substrate is used in this process, the filling property is required.

After said process is performed, the semiconductor device is obtained through wire bonding and molding processes.

The process for preparing the semiconductor device is not limited to the above procedure, but may also comprises any step and change the order of procedure. For example, it may also be performed by pressure sensitive adhesive layer curing—dicing—expanding processes, or dicing—expanding—pressure sensitive adhesive layer curing processes. Following the chip adhering process, a heating or cooling process may be further comprised.

Hereinafter, the present invention is explained in more detail through examples according to the present invention. However, the scope of the present invention is not restricted to the examples as shown below.

MODE FOR INVENTION

Example 1

A composition containing 66 parts by weight of an aromatic-based epoxy resin (novolac type epoxy resin, softening point 80° C.), 34 parts by weight of a phenol resin (phenol novolac resin, softening point 90° C.) as a hardener for epoxy resins, 200 parts by weight of an acrylic copolymer containing epoxy group (SA-55, manufactured by LG Chem, Ltd., Tg=9° C., weight average molecular weight 500,000), 0.3 parts by weight of a hardening accelerator (2-phenyl-4-methyl imidazole (2P4MZ) and 45 parts by weight of silica (melted silica, average particle diameter 75 nm) as a filler, was stirred and mixed in methyl ethyl ketone to prepare a varnish.

The prepared varnish was applied on a base film having a thickness of 38 μm (Release Polyester Film, RS-21G, manufactured by SKC), and dried at 110° C. for 3 minutes to prepare an adhesive film having a film thickness of 20 μm.

Example 2

A film was prepared by the same method as Example 1 above except that the film thickness was changed to 10 μm.

Example 3

A film was prepared by the same method as Example 1 above except that the thermoplastic acrylic resin had a glass transition temperature of 15° C. and its amount was changed to 400 parts by weight.

Example 4

A film was prepared by the same method as Example 1 above except that the amount of the thermoplastic acrylic resin was changed to 150 parts by weight and the amount of silica as a filler was changed to 20 parts by weight.

Comparative Example 1

A film was prepared by the same method as Example 1 above except that the glass transition temperature of the thermoplastic acrylic resin was changed to −15° C.

Comparative Example 2

A film was prepared by the same method as Example 1 above except that no filler was added.

Comparative Example 3

A film was prepared by the same method as Example 1 above except that the amount of the thermoplastic acrylic resin was changed to 50 parts by weight.

Evaluation Method

1. Tension Evaluation at Normal Temperature

A die bonding film is cut by 10 mm×50 mm (width×length) in the direction of coating. The center of the cut sample is left by 25 mm, and both ends are taped. Both taped ends are fixed on an equipment of evaluating tension, and tension is carried out at a speed of 0.3 mm/sec. From the obtained tension curve, a slope of elastic region and a yield strength being turning point between elastic region and plastic region are evaluated. Here, the used equipment of evaluating tension is Texture Analyzer by Stable Micro System Company (England).

2. Burr Evaluation

A dicing film (base film 100 μm, pressure sensitive adhesive part 10 μm) was laminated to a die bonding film and cut to prepare a dicing die bonding film. The prepared sample was attached to a wafer with a thickness of 75 μm, and then dicing was carried out as follows. In dicing, the die size is 5×5 mm, and the cutting depth reaches all of the wafer, the die bonding film and the pressure sensitive adhesive layer of the dicing film and 20 μm from the base film. Following dicing, the burr incidence was calculated about the dies, on which burrs were caused, in 100 dies. In dicing, the advance speed of blade is 40 mm/sec, and the revolution speed of blade is 40,000 rpm.

For each film obtained from the above examples and comparative examples, its yield strength, slope of tensile elastic region and burr incidence after dicing were shown in Table 1 below.

TABLE 1

|  | Example | | | | Comparative Example | | |
| --- | --- | --- | --- | --- | --- | --- | --- |
|  | 1 | 2 | 3 | 4 | 1 | 2 | 3 |
| Thickness of Adhesive Layer (μm) | 20 | 10 | 20 | 20 | 20 | 20 | 20 |
| Acrylic resin/ Epoxy Resin and Hardener | 2 (200/100) | 2 (200/100) | 4 (400/100) | 1.5 (150/100) | 2 (200/100) | 2 (200/100) | 0.5 (50/100) |
| Tg of Acrylic Resin (° C.) | 9 | 9 | 15 | 9 | −15 | 9 | 9 |
| Silica Amount | 45 | 45 | 75 | 20 | 45 | 0 | 22.5 |
| Yield Strength (gf) | 42 | 22 | 45 | 43 | 12 | 18 | 155 |
| Slope of Elastic Region (gf/mm) | 78 | 40 | 74 | 75 | 25 | 49 | 375 |
| Burr Incidence (%) | 1 | 2 | 1 | 1 | 25 | 11 | 13 |

The invention claimed is:

1. An adhesive film comprising a base film and an adhesive layer, wherein said adhesive layer has a yield strength of 20 to 50 gf and a slope of tensile elastic region of 30 to 80 gf/mm at a thickness of 5 to 50/μm.

2. The adhesive film according to claim 1, wherein the adhesive layer comprises a thermoplastic resin and a thermosetting resin.

3. The adhesive film according to claim 2, wherein the thermosetting resin comprises a hardener.

4. A dicing die bonding film comprising
a dicing film; and
the adhesive film, according to claim 3, formed on one side of said dicing film.

5. The adhesive film according to claim 2, wherein the mixing ratio of the thermoplastic resin and the thermosetting resin comprising a hardener (thermoplastic resin/thermosetting resin) is 1 to 5.

6. A dicing die bonding film comprising
a dicing film; and
the adhesive film, according to claim 5, formed on one side of said dicing film.

7. The adhesive film according to claim 2, wherein the thermoplastic resin is an acrylic copolymer comprising a functional group cross-linkable with the thermosetting resin.

8. The adhesive film according to claim 7, wherein the acrylic copolymer comprises one or more monomers selected from the group consisting of 2-hydroxyethyl (meth)acrylate, 2-hydroxypropyl (meth)acrylate, 2-hydroxybutyl (meth) acrylate, 4-hydroxybutyl (meth)acrylate, 2-hydroxyethylene glycol (meth)acrylate, or 2-hydroxylpropylene glycol (meth) acrylate, acrylic acid, methacrylic acid, acrylic acid dimer, itaconic acid, maleic acid, (meth)acrylonitrile, and glycidyl (meth)acrylate.

9. The adhesive film according to claim 7, wherein the acrylic copolymer has a glass transition temperature of −10 to 30° C.

10. The adhesive film according to claim 7, wherein the acrylic copolymer has a molecular weight of 100,000 to 2,500,000.

11. A dicing die bonding film comprising
a dicing film; and
the adhesive film, according to claim 7, formed on one side of said dicing film.

12. The adhesive film according to claim 2, wherein the thermosetting resin is an epoxy resin.

13. The adhesive film according to claim 12, wherein the epoxy resin is one or more selected from the group consisting of cresol novolac epoxy resin, bisphenol A type novolac epoxy resin, phenol novolac epoxy resin, tetrafunctional epoxy resin, biphenyl type epoxy resin, triphenol methane type epoxy resin, alkyl modified triphenol methane epoxy resin, naphthalene type epoxy resin, dicyclopentadiene type epoxy resin, and dicyclopentadiene modified phenol type epoxy resin.

14. A dicing die bonding film comprising
a dicing film; and
the adhesive film, according to claim 2, formed on one side of said dicing film.

15. The adhesive film according to claim 1, wherein the adhesive layer further comprises 5 to 20 parts by weight of a filler relative to 100 parts by weight of the whole composition.

16. The adhesive film according to claim 15, wherein the tiller is one or more selected from the group consisting of silica, alumina, aluminum hydroxide, calcium hydroxide, and carbon-based particles.

17. The adhesive film according to claim 15, wherein that the filler has an average particle diameter of 1 to 100 nm.

18. A dicing die bonding film comprising
a dicing film; and
the adhesive film, according to claim 1, formed on one side of said dicing film.

19. A semiconductor wafer, wherein the adhesive film of the dicing die bonding film according to claim 18 is attached to one side of the wafer and the dicing film is fixed on a wafer ring frame.

20. A semiconductor device comprising
a wiring substrate:
the adhesive film, according claim 1, attached to the chip-loading side of the wiring substrate; and
a semiconductor chip loaded on said adhesive film.

* * * * *